United States Patent [19]

Zappala' et al.

[11] 4,122,363
[45] Oct. 24, 1978

[54] CIRCUIT ARRANGEMENT FOR OBTAINING A SAWTOOTH CURRENT IN A COIL

[75] Inventors: Giuseppe Zappala'; Attilio Farina, both of Turin, Italy

[73] Assignee: Indesit Industria Elettrodomestici Italiana S.p.A., Italy

[21] Appl. No.: 764,612

[22] Filed: Feb. 1, 1977

[30] Foreign Application Priority Data

May 14, 1976 [IT] Italy .............................. 68178 A/76
May 14, 1976 [IT] Italy .............................. 69179 A/76

[51] Int. Cl.² .......................................... H03K 4/83
[52] U.S. Cl. .............................. 307/228; 307/252 J; 307/282; 328/65; 328/223; 315/408
[58] Field of Search ............... 328/65, 113, 223, 181; 307/228, 282, 252 J; 315/408, 410, 387

[56] References Cited

U.S. PATENT DOCUMENTS

| | | | |
|---|---|---|---|
| 2,946,958 | 7/1960 | Bonia et al. | 328/65 |
| 3,179,843 | 4/1965 | Schwartz | 315/408 |
| 3,333,120 | 7/1967 | Tomlin | 328/65 X |
| 3,363,184 | 1/1968 | Smith | 328/65 |
| 3,863,106 | 1/1975 | Haferl | 307/228 X |
| 3,993,931 | 11/1976 | Hollander | 315/408 |

Primary Examiner—John S. Heyman
Attorney, Agent, or Firm—Ladas, Parry, Von Gehr, Goldsmith & Deschamps

[57] ABSTRACT

A circuit arrangement for obtaining a periodic sawtooth current in a coil, particularly in a deflection coil of a kinescope, is described. The circuit arrangement comprises a first, unidirectional conductivity device, disposed in parallel to a circuit branch comprising the deflection coil, and a second, controllable switching device, having a control electrode connected to a source of periodic pulses which render conductive the second device during a part of the period of the sawtooth. The main feature of the circuit arrangement is to comprise a resonant series circuit disposed in parallel to the second device; the second device and the resonant series circuit are connected to the deflection coil and to the first device at least through a third, unidirectional conductivity device.

9 Claims, 4 Drawing Figures

CIRCUIT ARRANGEMENT FOR OBTAINING A SAWTOOTH CURRENT IN A COIL

BACKGROUND OF THE INVENTION

The present invention relates to a circuit arrangement for obtaining a periodic sawtooth current in a coil, particularly in a coil intended to provide the deflection of an electronic ray in a cathode-ray tube; said circuit arrangement is of the type comprising a first, unidirectional conductivity device and a second, controllable switching device whose control electrode is connected to a source of periodic drive pulses which render conductive the switching device during part of the sawtooth period. In particular, the present invention relates to a circuit in which said controllable switching device comprises a thyristor.

Circuits of this type, which take advantage of the sturdiness and firing easiness of the thyristors, are known long since.

However, it is known that the thyristors have two weak points:

they have to be extinguished by outer means at high power levels;

they require a certain recovery time between the extinction of the anode current and the application of a positive voltage to the anode.

The known circuits are of two types:

circuits in which the extinction of the thyristor is produced by a resonant circuit connected in series or in parallel to the thyristor used as unidirectional switch which "charges" the coil, which coil then discharges through a diode to return energy to the supply source (see, for example, S. A. Schwartz and L. L. Ornik, I.E.E.E. Transactions on BTR, November 1963, pages 9 ÷ 22).

The circuits of this type require a reactive energy circulation which is four times as high as the normal one, and therefore they have generally a rather low efficiency;

circuits in which a second thyristor serves to extinguish the first one, giving rise to a suitable oscillating current. (See, for instance, Italian Pat. No. 812,759).

Obviously, circuits of this second type are complex, inasmuch as they require, among other things, a duplication of the drive signals, with a suitable phase displacement of the latter.

Moreover, thyristors in the known circuits are allowed very short recovery times (3 to 5 microseconds) with respect to the sawtooth period, so that particularly fast thyristors are required.

SUMMARY OF THE INVENTION

It is an object of the present invention to provide a circuit arrangement for obtaining a sawtooth current in a coil, which will require the use of only one controllable switching device and grant to it relatively long recovery times with respect to the period of the sawtooth, and which, moreover, will be simple and such as not to have the described disadvantages of the known circuits.

Therefore, the object of the present invention is to provide a circuit arrangement for obtaining a periodic sawtooth current in a coil, particularly in a deflection coil of a kinescope, comprising: a first, unidirectional conductivity device, disposed in parallel to a circuit branch comprising said deflection coil; a second, controllable switching device, having a control electrode connected to a source of periodic pulses which render conductive said second device during a part of the period of said sawtooth; a resonant series circuit disposed in parallel to said second device; said second device and said resonant series circuit being connected to said deflection coil and to said first device at least through a third, unidirectional conductivity device.

BRIEF DESCRIPTION OF THE DRAWINGS

The invention will now be described in detail with reference to the accompanying drawings which are given by way of non limitative example only and in which.

DETAILED DESCRIPTION OF THE INVENTION

Figure 1:
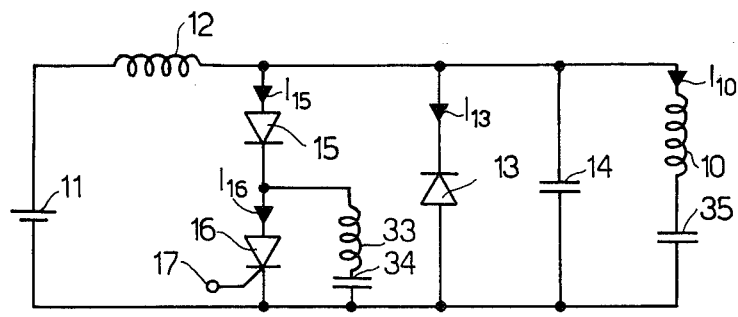
FIG. 1 is a wiring diagram of a circuit arrangement for obtaining a sawtooth current in a coil, according to the principles of the invention.

In FIG. 1 there is shown a circuit according to the invention, for obtaining a sawtooth current in a coil 10.

A battery 11 is connected by its positive pole to an end of a supply decoupling coil (choke) 12. The other end of choke 12 is connected: to one end of coil 10, to the cathode of a diode 13, to one end of a capacitor 14 and to the anode of a diode 15. The cathode of diode 15 is connected to the anode of a thyristor (or SCR) 16, whose cathode is connected to the negative terminal of battery 11. Thyristor 16 is provided with a gate electrode 17 on which a conduction firing pulse from a source of pulses (not shown) is applied. Connected in parallel to thyristor 16 is the series of a coil 33 and a capacitor 34 which form a resonant series circuit. Connected to the other end of coil 10 is one end of a capacitor 35. The other end of capacitors 14, 34 and 35, the anode of the diode 13 and the cathode of the thyristor 16 are connected to the negative pole of battery 11.

Figure 2:
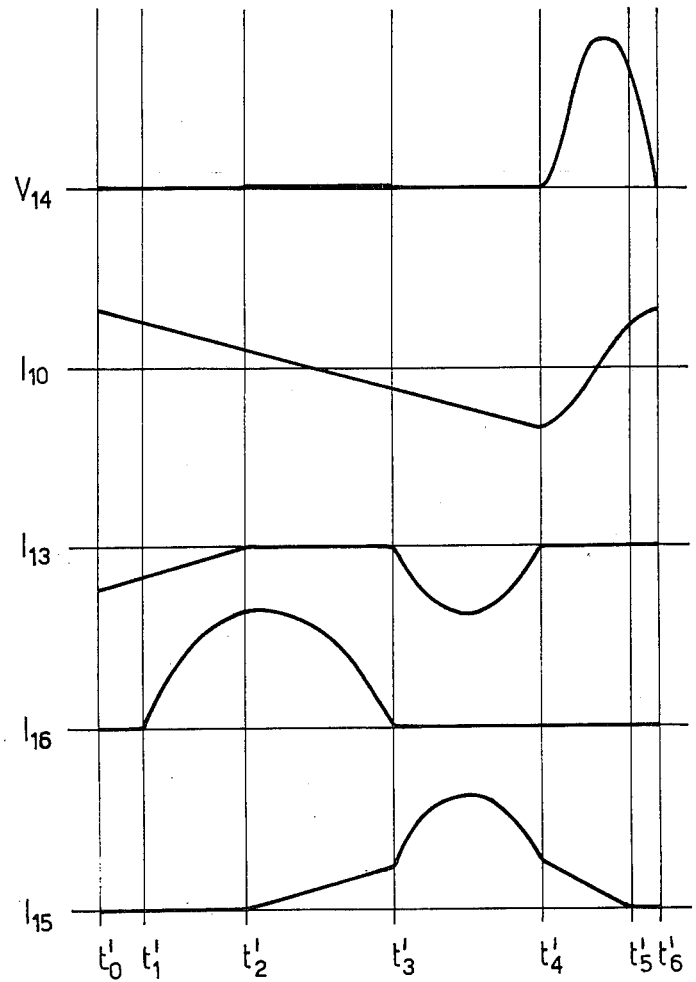
FIG. 2 shows waveforms of some currents and of a voltage which are present in some points of the circuit of FIG. 1.

The operation of the circuit shown in FIG. 1 will now be explained with reference to FIG. 2 in which there are shown, not to scale, the behaviours of some voltages and currents. FIG. 2 contains five superposed lines. On the first line there is shown the behaviour of the voltage $V_{14}$ at the ends of the capacitor 14; on the second line there is shown the behaviour of the current $I_{10}$ in the coil 10; on the third line there is shown the behaviour of the current $I_{13}$ in the diode 13; on the fourth line there is shown the behaviour of the anodic current $I_{16}$ of the thyristor 16; on the fifth line there is shown the behaviour of the current $I_{15}$ in the diode 15.

In the abscissa there are shown the times; seven successive instants are indicated: $t_0'$, $t_1'$ . . . $t_6'$. The time interval from $t_0'$ to $t_6'$ corresponds to a complete cycle.

The operation of the circuit of FIG. 1 takes place as follows.

At the instant $t_1'$ a suitable firing pulse arrives at the gate electrode 17 of the thyristor 16. Since capacitor 34 is charged, an oscillating current $I_{16}$ (see fourth line of FIG. 2) begins to flow within the circuit formed by thyristor 16, capacitor 34 and coil 33. However, diode 15 is open for the moment; ths sawtooth current $I_{10}$ which circulates in the coil 10 closes, in fact, through diode 13 (third line of FIG. 2). At the instant $t_2'$ the current $I_{13}$ in diode 13 reaches the value zero, diode 13 is cut-off, whilst diode 15 becomes conductive; the current $I_{10}$ of the coil 10 circulates now in the diode 15 (fifth line of FIG. 2).

This behaviour continues up to the instant $t_3'$, i.e. till the conduction within thyristor 16 extinguishes because the oscillating current $I_{16}$ passes through zero. At the instant $t_3'$ the diode 13 becomes conductive again, thereby allowing the oscillating current in the branch formed by coil 33 and capacitor 34 to circulate in the reverse direction, and consequently capacitor 34 to recharge itself.

Finally, at the instant $t_4'$ the diode 13 cuts off again thereby releasing the return oscillation which initially (interval $t_4' - t_5'$) takes place according to the laws of the two-pole circuit formed by coils 10 and 33 and capacitors 14 and 34 (neglegting the capacitor 35 which has a much higher capacity and may, in first approximation, be considered a short circuit for the alternate currents).

The voltage $V_{14}$ at the ends of the capacitor 14 rises rapidly towards a maximum to return then to zero (see first line of FIG. 2). At a certain point (instant $t_5'$) diode 15 is cut-off, thereby insulating the resonant circuit which comprises coil 33 and capacitor 34, and thus leaving charged capacitor 34 whilst capacitor 14 is discharged onto coil 10.

At the moment in which the voltage $V_{14}$ at the ends of capacitor 14 is reversed (instant $t_6'$), diode 13 becomes conductive thereby terminating the return section and initiating the forward course of the scansion (instant $t_0'$).

The circuit described is simple; it requires only one thyristor (16) and two diodes (13 and 15) for realizing an electronic bipolar switch which will allow to obtain the desired sawtooth current in a coil (coil 10).

Owing to the particular circuit arrangement the self-extinction of the thyristor 16 and the external synchronization of the repetition frequency are ensured. The time available for the recovery of the thyristor 16 (interval $t_3' - t_4'$) is considerable (15 → 20 microseconds).

Moreover, capacitor 35 avoids the presence of an undesirable component of direct current in coil 10 and originates the so-called "S" correction of the current $I_{10}$ in coil 10 to arrange that the current in coil 10 does not present a substantially linear behaviour (such correction is necessary if coil 10 is utilized to deflect an electronic ray of a kinescope having a substantially flat screen) in order to correct the so-called tangent error due to the fact that the centre of curvature of the screen and the deflection centre do not coincide.

The following Table shows the values of an embodiment of the circuit of FIG. 1 which has been experimented in practice:

Table of the values coil 12: 5,2 mH
capacitor 14: 27 nF
deflection coil 10: 300 μH
coil 33: 430 μH
capacitor 34: 150 nF
capacitor 35: 1,8 μF.

Figure 3:
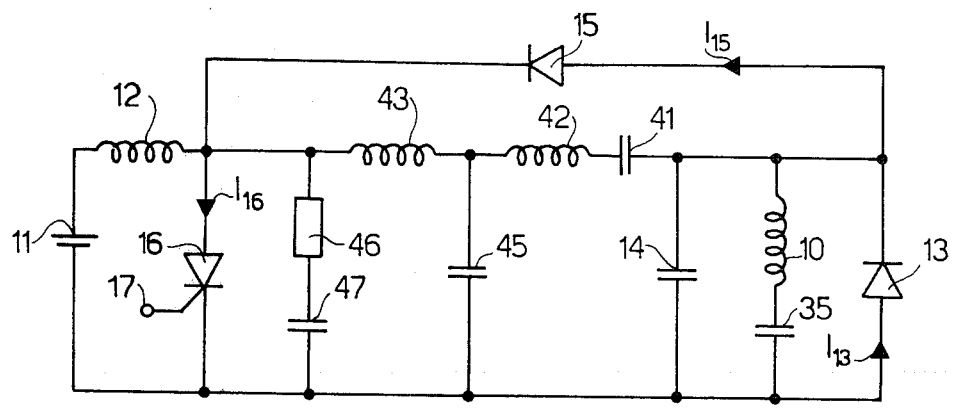
FIG. 3 shows a wiring diagram of a second circuit arrangement for obtaining a sawtooth current in a coil, according to the principles of the invention.

FIG. 3 shows a different embodiment of the circuit according to the invention. In comparison with the circuit shown in FIG. 1, the cathode of diode 13 is connected to the anode of thyristor 16 also through the series of a capacitor 41 and two coils 42 and 43. The connection between coils 42 and 43 is connected to one end of a capacitor 45 whose other end is connected to the negative terminal of battery 11. Coil 12, one end of which is connected to the positive pole of the battery 11, has its other end connected to the cathode of the diode 15 and accordingly to the anode of the thyristor 16. Connected in parallel to thyristor 16 is the series of a resistor 46 with a capacitor 47.

To explain the operation of the circuit shown in FIG. 3 reference will be made to the waveforms represented to FIG. 4 which are not to scale.

Figure 4:
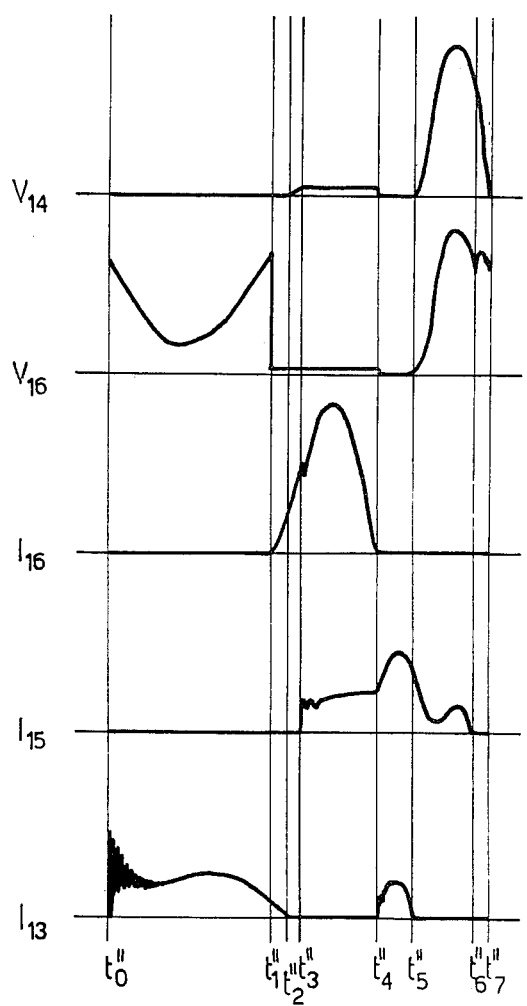
FIG. 4 shows the behaviour of voltages and currents which are present in some points of the circuit of FIG. 3.

FIG. 4 has five lines.

The first line shows the behaviour of the voltage $V_{14}$ at the ends of capacitor 14; the second line shows the behaviour of the voltage $V_{16}$ at the ends of the thyristor 16; the third line shows the behaviour of anodic current $I_{16}$ of thyristor 16; the fourth line shows the behaviour of the current $I_{15}$ in the diode 15; the fifth line shows the behaviour of the current $I_{13}$ in the diode 13.

In the abscissa in FIG. 4 there are shown the times. Eight successive instants are indicated therein, namely: $t_0'', t_1'' \ldots t_7''$. The time interval from $t_0''$ to $t_7''$ corresponds to a complete cycle.

The circuit shown in FIG. 3 operates as follows.

At the instant $t_0''$ the diode 13 is conductive whilst diode 15 and thyristor 16 are not conductive.

In the circuit formed by the elements 10, 35 and 13 there circulates a sawtooth current which decreases in an approximately linear fashion. At the same time, an oscillating current circulates in the circuit formed by the elements 41, 42 and 45. Also this current passes into the diode 13 and superimposes to the sawtooth current from deflection coil 10. The behaviour of the current $I_{13}$ in the diode 13 can be seen on the fifth line of FIG. 4 between the instants $t_0''$ and $t_2''$.

The behaviour of the voltage at the ends of capacitor 45 can be observed on the second line of FIG. 4 between instants $t_0''$ and $t_1''$; in reality, on said line there is shown the voltage 16 on thyristor 16 which is a fraction, near to the unit, of the voltage on capacitor 45, owing to the division effected between coils 12 and 43.

At the instant $t_1''$ a firing pulse is applied to the electrode 17 of the thyristor 16.

Thyristor 16 is fired, the voltage $V_{16}$ on the anode drops suddenly almost to zero (FIG. 4, second line) and the current $I_{16}$ of the thyristor 16 initiates increasing (FIG. 4, third line); the current $I_{16}$ in the thyristor 16 is substantially the oscillating current which is produced in the resonant series circuit formed by elements 43 and 45. Said current $I_{16}$ has a substantially sinusoidal behaviour, reaches a maximum value and returns to zero at the instant $t_4''$. In the meantime (instant $t_2''$), current $I_{13}$ in the diode 13 has dropped to zero, so that the conduction in the diode 13 is interrupted; however, almost immediately after (instant $t_3''$), diode 15 becomes conductive (FIG. 4, fourth line), so that the current of the coil 10 may continue flowing within elements 16 and 15.

At the instant $t_4''$ the oscillating current of the resonant series circuit formed by coil 43 and capacitor 45 inverts, so that the conduction in the thyristor 16 is interrupted, whilst diode 13 becomes conductive again and the current of said circuit formed by coil 43 and capacitor 45 flows within elements 35 and 13 (FIG. 4, fourth and fifth lines, instant from $t_4''$ to $t_5''$).

At the instant $t_5''$ the current of the resonant series circuit formed by coil 43 and capacitor 45 inverts again, so that diode 13 cuts off. Since also thyristor 16 is cut off, for the first time from instant $t_0''$ there is no direct path for the current in the deflection coil 10.

Since diode 15 is still conductive and since we may in first approximation neglegt the branches represented by coil 12 and series circuit formed by coil 42 and capacitor 41, which has a high impedance with respect to the other circuits, the oscillating circuit, between the instants $t_5''$ and $t_6''$, i.e. as long as diode 15 is conductive, results in being formed essentially by elements 10 and 14, which form a resonant parallel circuit, and by elements 43 and 45 which form a resonant series circuit.

This four element circuit has two poles; the voltage $V_{14}$ at the ends of the capacitor 14 rises rapidly towards a maximum (FIG. 4, first line) to drop then again; said voltage results essentially from the sum of two sinusoids having different frequency; said frequencies are just those of the poles of the circuit.

At the instant $t_6''$ the current $I_{15}$ in the diode 15 reaches the zero value; diode 15 cuts off and therefore the circuit again changes configuration. Whilst the voltage $V_{14}$ at the ends of the capacitor 14 shifts rapidly towards zero, the voltage on thyristor 16 rises again (because of the voltage which is present on capacitor 45), as can be seen in FIG. 4, second line, instant $t_6''$.

This short stage from $t_6''$ to $t_7''$ is important because during said stage the deflection circuit (elements 10 and 14) receives from the remaining part of the circuit (elements 41, 42 and 45) the energy which is necessary to make up for the losses.

It is the coupling formed by the elements 41 and 42 which allows to let flow the current within diode 15 during the first stage of the return section ($t_5'' - t_6''$) and to give energy to the deflection circuit (10, 14) during the second part of the return section.

It has been found that it is suitable for said coupling branch (comprising the elements 41 and 42) to be tuned approximately at the repetition frequency of the sawtooth current which it is desired to generate.

At the instant $t_7''$ when the voltage $V_{14}$ at the ends of the capacitor 14 inverts, diode 13 becomes conductive again; thus we have again the initial situation (instant $t_0''$).

Resistor 46 and capacitor 47 form a network for the attenuation of the parassitic oscillations which would occur at the ends of thyristor 16 upon cutting-off of the diode 15 (instant $t_6''$).

The following Table shows by way of information the values of the components of an embodiment of the circuit of FIG. 3 which has been experimented in practice.

Table of the values coil 12: 1,8 mH
resistor 46: 560 ohm
coil 43: 0,2 mH
capacitor 47: 3,3 nF
coil 42: 1,8 mH
capacitor 45: 68 nF
capacitor 41: 39 nF
capacitor 14: 39 nF
deflection coil 10: 0,3 mH
capacitor 35: 1,8 μF The circuit of FIG. 3, in addition to the advantages described for the circuit of FIG. 1 has the advantage that the maximum voltage on thyristor 16 is equal to the maximum voltage on deflection coil 10, and that the ratio between said maximum voltages and the supplying voltage of battery 11 may be varied within a wide range by acting for example on the value of the coil 42 and/or on the value of the capacitor 41.

With the values shown in the above Table said ratio is about three.

Since there are commonly available thyristors suitable for maximum voltages of 700 Volts and deflection coils arranged to operate with voltages of the same order, the circuit shown in FIG. 3 is fit for operating with a supply voltage of 220 Volts which is easily obtainable from the domestic distribution network.

From the foregoing description, the advantages of the circuit arrangement according to the present invention are clearly apparent. Also clearly apparent is that variations of the circuits described hereinabove by way of example only will be possible to those skilled in the art without departing from the principles of novelty of the inventive idea.

What we claim is:

1. Circuit arrangement for obtaining a periodic sawtooth current in a coil (10), particularly in a deflection coil of a kinescope, comprising:
   (a) a first diode (13) connected in parallel to a first circuit branch including said coil;
   (b) a controllable switching device (16) having a control electrode (17) coupled to a source of periodic pulses which render said switching device conductive in a given conductive direction during a portion of the trace period of said sawtooth current;
   (c) a second diode (15) connected in series with said switching device (16) with a conductive direction the same as said given conductive direction to form a second circuit branch connected in parallel to said first diode (13) with a conductive direction opposite to said given conductive direction;
   (d) a resonant series circuit (33, 34; 43, 45) connected in parallel to said switching device (16); and
   (e) means (11) for supplying electrical energy, said energy supplying means having a first connection to the side of said switching device (16) remote from said second diode (15) and a second connection through a first receive means (12) to one side of said second diode (15).

2. The arrangement of claim 1, wherein in parallel to said second diode (15) is connected a second reactive means (41, 42, 43) which includes a capacitor (41).

3. The arrangement of claim 2, wherein said second reactive means further includes a coil (42) which forms together with said capacitor (41) a resonant circuit.

4. The arrangement of claim 3, wherein said resonant circuit has a resonance frequency substantially matching the repetition frequency of the sawtooth current.

5. The arrangement of claim 1, wherein said switching device (16) is a thyristor.

6. The arrangement of claim 1, wherein in said first circuit branch there is disposed in series to said coil (10) a correcting capacitor (35) for introducing an "S" correction into the sawtooth current during the trace period thereof.

7. The arrangement of claim 1, wherein said first diode (13), said switching device (16) and said second diode (15) are respectively rendered conductive in sequence in the trace period ($t_0' - t_4'$; $t_0'' - t_5''$) of each cycle of said sawtooth current.

8. The arrangement of claim 1, wherein the sawtooth current obtained in said coil (10) has a return period comprising a first part ($t_4' - t_5'$; $t_5'' - t_6''$) and a second part ($t_5' - t_6'$; $t_6'' - t_7''$), and wherein only said second diode (15) is rendered conductive during the first part of said return period and said first diode (13), said switching device (16) and said second diode (15) are rendered non-conductive during the second part of said return period.

9. The arrangement of claim 1, wherein said coil (10) conducts said sawtooth current continuously throughout five successive stages of the trace period ($t_0''$ - $t_5''$) of said sawtooth current, said first diode (13) conducting in the first stage ($t_0''$ - $t_1''$), said first diode (13) and said switching device (16) conducting in the second stage ($t_1''$ - $t_2''$), said switching device (16) conducting in the third stage ($t_2''$ - $t_3''$), said switching device (16) and said second diode (15) conducting in the fourth stage ($t_3''$ - $t_4''$), and said second diode (15) and first diode (13) conducting in the fifth stage ($t_4''$ - $t_5''$).

* * * * *

UNITED STATES PATENT AND TRADEMARK OFFICE
CERTIFICATE OF CORRECTION

PATENT NO. : 4,122,363
DATED : October 24, 1978
INVENTOR(S) : Giuseppe ZAPPALA et al It is certified that error appears in the above—identified patent and that said Letters Patent are hereby corrected as shown below:

In claim 1, line 24, the word "receive" should read

--reactive--.

Signed and Sealed this

Second Day of January 1979

[SEAL]

Attest:

RUTH C. MASON
Attesting Officer

DONALD W. BANNER
Commissioner of Patents and Trademarks